United States Patent [19]
Kay

[11] 4,228,789
[45] Oct. 21, 1980

[54] SOLAR ENERGY COLLECTOR

[76] Inventor: James C. Kay, R.F.D. #6, Rome, Ga. 30161

[21] Appl. No.: 943,817

[22] Filed: Sep. 19, 1978

[51] Int. Cl.³ .............................................. F24J 3/02
[52] U.S. Cl. .................................. 126/439; 126/441; 126/450; 136/246
[58] Field of Search ............... 126/271, 270, 441, 439, 126/442, 450; 237/1 A; 136/89 PC

[56] References Cited

U.S. PATENT DOCUMENTS

| | | | |
|---|---|---|---|
| 2,969,788 | 1/1961 | Newton | 126/271 |
| 3,964,464 | 6/1976 | Hockman | 126/270 |
| 3,982,527 | 9/1976 | Cheng et al. | 126/270 |
| 4,026,269 | 5/1977 | Stelzer | 126/271 |
| 4,077,393 | 3/1978 | Mattson | 126/271 |
| 4,079,724 | 3/1978 | Zwillinger | 126/271 |
| 4,148,298 | 4/1979 | Sherman | 126/271 |

*Primary Examiner*—James C. Yeung
*Assistant Examiner*—Daniel O'Connor
*Attorney, Agent, or Firm*—Cushman, Darby & Cushman

[57] ABSTRACT

A solar energy collector is provided with a transparent, corrugated cover. An internal system of curved mirrors concentrates the radiant energy toward a thermally insulated chamber which houses either a set of heat exchanger tubes with a heat exchange fluid flowing through them or a photovoltaic device for converting thermal energy to electricity.

6 Claims, 2 Drawing Figures

SOLAR ENERGY COLLECTOR

BACKGROUND OF THE INVENTION

The present inventor has become aware of the following prior U.S. patents:

| Patentee | U.S. Pat. No. | Issue Date |
|---|---|---|
| Kapany | 3,985,116 | Oct. 12, 1976 |
| Robertson | 3,990,430 | Nov. 9, 1976 |
| Rabl | 3,991,740 | Nov. 16, 1976 |
| Smith | 4,030,477 | June 21, 1977 |
| Bakun, et al | 4,037,583 | July 26, 1977 |
| Cook | 4,046,133 | Sept. 6, 1977 |
| Jones | 4,055,161 | Oct. 25, 1977 |

In each instance, the collector includes concentrators and/or reflectors for increasing efficiency by directing more of the incident sunlight toward the heat absorber within the collector. (In general, the prior art devices appear to be of "sandwich" construction, with the absorber located directly below the transparent cover, rather than off towards one edge. Note a variation of the latter in the Rabl patent.)

In addition, the following prior U.S. patents show solar energy collectors or similar devices having radiant energy focusing structures which include angled or curved reflective surfaces:

| Patentee | U.S. Pat. No. | Issue Date |
|---|---|---|
| Harrison | 1,258,405 | Mar. 5, 1918 |
| Shipman | 1,683,266 | Sept. 4, 1928 |
| Johnson | 1,742,861 | Jan. 7, 1930 |
| Freund | 2,467,885 | Apr. 19, 1949 |
| Newton | 2,969,788 | Jan. 31, 1961 |
| Hervy | 3,321,012 | May 23, 1967 |
| Clark | 3,866,285 | Feb. 18, 1975 |
| Rineer | 3,915,147 | Oct. 28, 1975 |
| Fletcher for Shimada | 3,915,148 | Oct. 28, 1975 |
| Winston | 3,923,381 | Dec. 2, 1975 |
| Mlavsky | 3,976,508 | Aug. 24, 1976 |
| Bezborodko | 4,038,971 | Aug. 2, 1977 |
| Orrison | 4,038,972 | Aug. 2, 1977 |
| Weinstein, et al | 4,052,782 | Oct. 11, 1977 |
| Barrio de Mendoza | 4,059,094 | Nov. 22, 1977 |
| Wasserman | 4,067,319 | Jan. 10, 1978 |

In the same regard, the following publication is of interest:

R. Winston and H. Hinterberger, *Principles of Cylindrical Concentrators for Solar Energy*, Argonne National Laboratory paper SOL 74-01, September 1974.

So recently have they issued that the present inventor has become aware only contemporaneously with making his patent application, of the following prior U.S. patents, each of which shows a solar energy collector having a version of transparent corrugated cover:

| Patentee | Patent No. | Issue Date |
|---|---|---|
| Mattson | 4,076,015 | Feb. 28, 1978 |
| Mattson | 4,077,393 | Mar. 7, 1978 |

Additional literature on various designs of concentrating collectors is widely available. See, for instance, the following publications:

Bruce Anderson, The Solar Home Book, heating, cooling and designing with the sun, Cheshire Books, Harrisville, New Hampshire (1976), pp. 180–183.

Donald Watson, Designing and Building a Solar House, Your Place in the Sun, Garden Way Publishing, Charlotte, Vermont (1977), pp. 42–46; 67–75; 116–119.

Encyclopedia Britannica 3, article "Solar Collectors", section "Concentrators".

SUMMARY OF THE INVENTION

A solar energy collector is provided with a transparent, corrugated cover. An internal system of curved mirrors concentrates the radiant energy toward a thermally insulated chamber which houses either a set of heat exchanger tubes with a heat exchange fluid flowing through them or a photovoltaic device for converting thermal energy to electricity.

The principles of the invention will be further discussed with reference to the drawings wherein preferred embodiments are shown. The specifics illustrated in the drawings are intended to exemplify, rather than limit, aspects of the invention as defined in the claims.

DETAILED DESCRIPTION OF THE PRESENTLY PREFERRED EMBODIMENTS OF THE INVENTION

Figure 1:
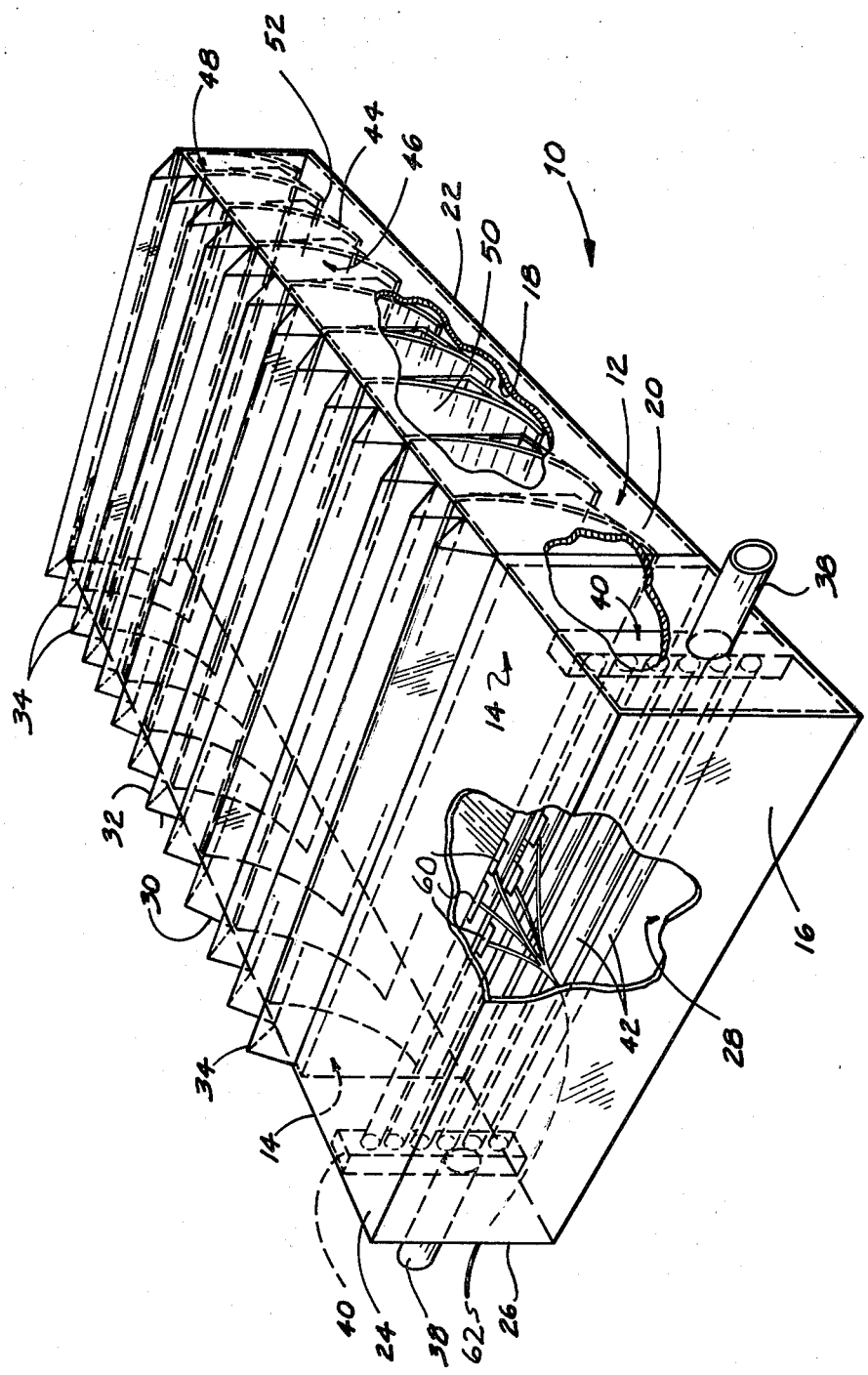
FIG. 1 is a perspective view of one embodiment of the solar energy collector of the present invention, with portions cut away to expose interior details.
Figure 2:
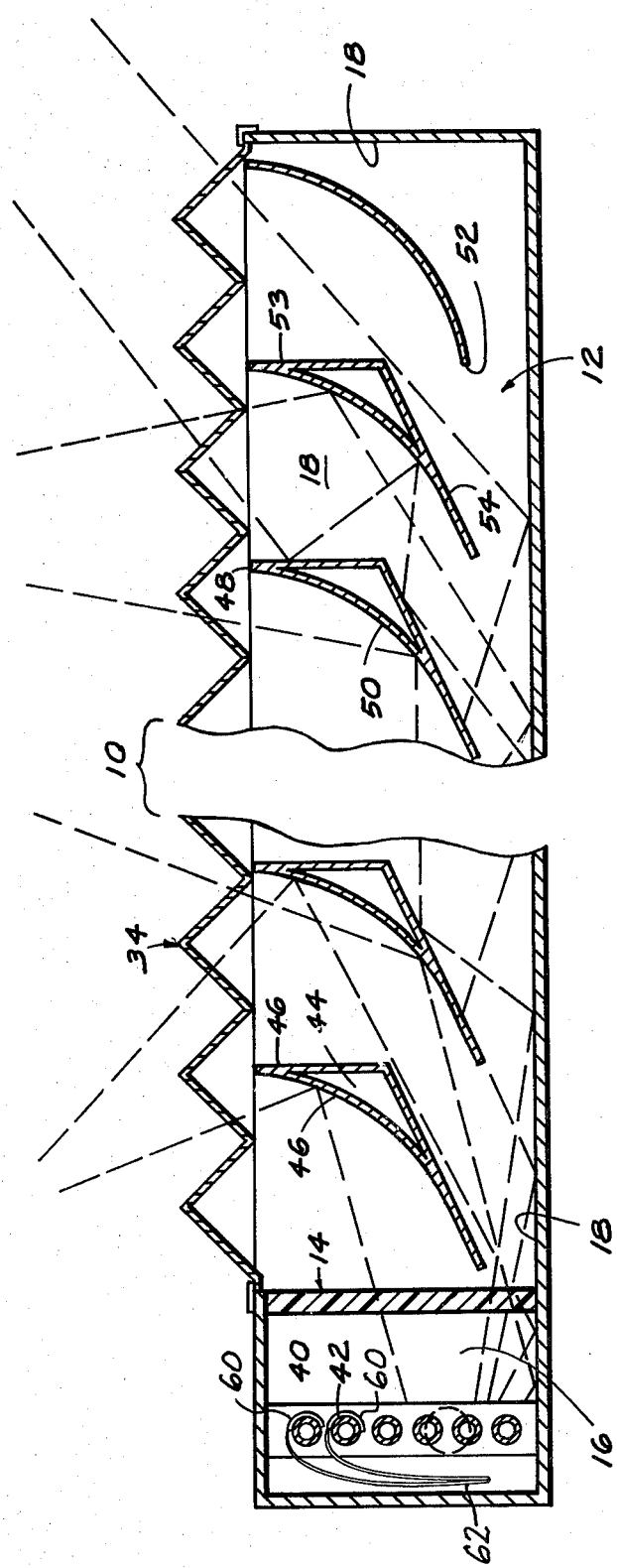
FIG. 2 is a fragmentary longitudinal vertical sectional view thereof.

In FIGS. 1 and 2, the solar energy collector 10 is seen to include a generally rectangular primary housing 12 sharing one end wall 14 in common with a secondary housing 16. The interior surface 18 of the peripheral sidewalls 20 and floor 22 of the primary housing 12 are provided with a suitable reflective coating, i.e. a mirror surface. The top wall 24 peripheral sidewalls 26 and floor 28 of the secondary housing are made of thermal insulating material.

The shared wall 14 is made of relatively infra-red energy-transparent material such as glass.

The primary housing 12 is roofed by a cover 30 of transparent glazing material. By strong preference, the panel 30 is not merely a flat sheet, but is corrugated, zig-zag, i.e. saw-tooth fashion in the orientation depicted. That is, the corrugations are in a single series which proceeds longitudinally of the collector. As depicted, the cover 30 is relatively elevated, and the triangular ends 32 also are glazed with the same transparent material. If the cover 30 is made to rest lower in the collector, so that the ridges 34 are level with the upper edges 36 of the walls 14 and 20, the panel 30 may be constituted by a cut portion of an extrusion, with no need for closure of the ends 32. In any event, it is preferred that the glazing panel 30 be an integral body formed by casting, molding, vacuum forming or the like. Preferably it is made of transparent plastic material, e.g. polycarbonate resin, conventionally stabilized against dyeing or opaquefacation from subjection to sunlight.

Each apex angle $\alpha$ preferably is about 90°.

Two opposed sidewalls of the secondary housing are shown passing pipe nipples 38 which connect within the secondary housing with respective manifold pipes 40 between which pass a plurality of heat exchanger tubes 42. By preference, the heat exchanger tube assembly 40, 42, i.e. the collector plate is constituted in a single vertically extending series that is one pipe wide. However, a more extensive heat exchanger tube assembly could be provided. Either of the nipples 38 serves as a heat exchange fluid inlet and the other serves as a heat exchange fluid inlet. Generally, the heat exchange fluid used may be any that is commonly used in solar energy collectors which employ heat exchange fluids flowing through tubes. Water is one example of a useful heat exchange fluid; air is another.

The piping 40, 42 is made of standard materials, e.g. galvanized iron or copper.

The collecting efficiency is improved when the heat exchange collector plate 40, 42 is coated a dark color, e.g. flat black.

The device 10, as shown is completed by a series of specially shaped three-sided mirrors, e.g. baffles 44 having highly reflective coatings 46 on all three sides. The front faces of the baffles are each generally cylindrically concave throughout, approximately 60°, while the back is composed of a vertical leg 53 extending from the upper extent of the baffle 48 to the intersection of the lower leg 54. Each extends from one sidewall of the primary housing to the opposite sidewall thereof in a series that proceeds at right angles to the series of corrugations of the cover panel. Each baffle extends from the upper edges of the sidewalls and nearly to the floor of the primary housing, for instance about three-quarters of the distance. At its upper extent 48, each baffle 44 is angled at least slightly from vertical in a sense to reflect rays incident upon its upper side 50 toward the shared wall 14. At its lower extent 52, each baffle 44 is angled at least slightly from horizontal in a sense also to reflect rays incident upon its upper side toward the shared wall 14. The individual baffles 44 are so spaced from one another in the series that the upper edge 48 of each one is approximately in vertical alignment with the lower edge 52 of its upstream neighbor. The silvering of the baffles 44 and the interior of the primary housing (but for the transparent glazing panel 30 and transparent shared wall 14) ensures that much of the sunlight entering the primary housing and striking surfaces therein will be forwarded through the wall 14 and strike the collector plate 40, 42 within the secondary housing.

In use, the device 10 is mounted, either flatly as shown or obliquely, e.g. upon a pitched roof, so that the track of the Sun during the day is transverse to the device. In other words, FIG. 2 shows the device located in a north-south or south-north left-to-right spatial disposition. Thus, (and this can be seen best with relation to FIG. 1) whether the Sun is directly overhead or is low in the East or West, a large percentage of the Sun's rays will strike the corrugated cover panel 30 at a sufficiently high angle that they will penetrate the cover panel 30, strike the baffles 44 and be reflected through the shared wall 14 and onto the collector plate 40, 42. Heat exchange fluid flowing through the collector plate thus will be warmed. The warmed fluid may be used for any purpose, i.e. domestic space heating, domestic water heating or preheating, heat storage and the like.

The device 10 may be made in various sizes and proportions as desired.

Should there be a need for desire to produce electricity directly using the device 10, there may be provided within the secondary housing in place of or intercalated with the collector plate 40, 42 as described so far, a bank of commercially available photovoltaic cells 60, with appropriate electrical lead wires 62 exiting therefrom.

The respective parts of the device may be made of the materials and using the techniques used in providing the comparable parts of prior art structures.

It should now be apparent that the solar energy collector as described hereinabove, possesses each of the attributes set forth in the specification under the heading "Summary of the Invention" hereinbefore. Because it can be modified to some extent without departing from the principles thereof as they have been outlined and explained in this specification, the present invention should be understood as encompassing all such modifications as are within the spirit and scope of the following claims.

What is claimed is:

1. A solar energy collector, comprising:
   floor and upstanding perimetrical wall means providing a primary housing, including one transparent sidewall portion;
   a transparent panel covering said primary housing;
   a longitudinally extending, series of transversally extending, curved light-reflecting baffles mounted within said primary housing for focusing towards said one transparent sidewall portion the sunlight which enters the primary housing through said transparent panel when sunlight is incident upon said solar energy collector;
   the curved light-reflecting baffles each comprising a generally cylindrically curved arcuate body of approximately 60° in arcuate extent and each being oriented in the primary housing so as to have a concave upper surface with an upper edge that is nearly vertical and a lower edge that is forwardly and downwardly slanted but nearly horizontal, the upper edge of each baffle being generally in vertical alignment with the lower edge of its respectively upstream neighbor;
   roof, floor and upstanding perimetrical wall means providing a secondary housing located downstream of said series of baffles, said secondary housing including said transparent sidewall portion, the remainder of these wall means being of thermally insulating material; and
   collector plate means housed within the secondary housing and including means for leading collected energy from the solar energy collector secondary housing.

2. The collector of claim 1, wherein:
   the collector plate means includes a bank of heat exchanger tubes for conducting a heat exchange fluid into, through and from the secondary housing in which sunlight entering the secondary housing through said transparent sidewall portion may be incident thereupon.

3. The collector of claim 1, wherein:
   the collector plate means includes a bank of photovoltaic cells.

4. The collector of claim 1, wherein:
   said transparent panel covering said primary housing is corrugated so as to have a series of corrugations which extends parallel to the series of curved light baffles.

5. The collector of claim 4, wherein:
   the corrugations are of saw-toothed form.

6. The collector of claim 1, wherein:
   the curved light-reflecting baffles each comprise a generally cylindrically curved arcuate body of approximately 60° in arcuate extent and each is oriented in the primary housing so as to have a concave upper surface with an upper edge that is nearly vertical and a lower edge that is nearly horizontal, the upper edge of each baffle being generally in vertical alignment with the lower edge of its respectively upstream neighbor.

* * * * *